(12) United States Patent
Mangione-Smith et al.

(10) Patent No.: US 8,243,045 B2
(45) Date of Patent: Aug. 14, 2012

(54) TOUCH-SENSITIVE DISPLAY DEVICE AND METHOD

(75) Inventors: William Henry Mangione-Smith, Kirkland, WA (US); Andrew Wolfe, Los Gatos, CA (US); Thomas Martin Conte, Atlanta, GA (US)

(73) Assignee: Empire Technology Development LLC, Wilmington, DE (US)

( * ) Notice: Subject to any disclaimer, the term of this patent is extended or adjusted under 35 U.S.C. 154(b) by 676 days.

(21) Appl. No.: 12/401,124

(22) Filed: Mar. 10, 2009

(65) Prior Publication Data

US 2010/0231548 A1 Sep. 16, 2010

(51) Int. Cl.
*G06F 3/044* (2006.01)
(52) U.S. Cl. ........................................................ 345/174
(58) Field of Classification Search ........................ None
See application file for complete search history.

(56) References Cited

U.S. PATENT DOCUMENTS

| | | | |
|---|---|---|---|
| 4,293,734 A | 10/1981 | Pepper, Jr. | |
| 4,853,498 A | 8/1989 | Meadows et al. | |
| 5,041,701 A | 8/1991 | Wolfe et al. | |
| 5,438,168 A | 8/1995 | Wolfe et al. | |
| 5,510,813 A | 4/1996 | Makinwa et al. | |
| 5,736,688 A | 4/1998 | Barrett et al. | |
| 6,037,930 A | 3/2000 | Wolfe et al. | |
| 6,623,608 B2 | 9/2003 | Cropper et al. | |
| 6,879,319 B2 | 4/2005 | Cok | |
| 6,885,157 B1 | 4/2005 | Cok et al. | |
| 7,167,169 B2 | 1/2007 | Libsch et al. | |
| 7,230,608 B2 | 6/2007 | Cok | |
| 7,361,860 B2 * | 4/2008 | Caldwell | 345/173 |
| 2003/0111588 A1 | 6/2003 | Chen | |
| 2005/0030162 A1 | 2/2005 | Stambaugh | |

* cited by examiner

*Primary Examiner* — Wayne Young
*Assistant Examiner* — Brian Butcher
(74) *Attorney, Agent, or Firm* — Dorsey & Whitney LLP

(57) ABSTRACT

The present disclosure generally relates to a touch-sensitive LED display device with a number of shared circuits having measurement circuitry electrically coupled to display circuitry. A processor receives signals from the measurement circuitry and may compare the signals to determine a location of the touch on the touch screen.

19 Claims, 9 Drawing Sheets

600 A computer program product

610 A signal bearing medium

620 At least one of
  one or more instructions for coupling power to one or more of a plurality of touch sensitive locations in the display;
  one or more instructions for generating individual charges at each of the plurality of touch sensitive locations in the display when power is coupled thereto;
  one or more instructions for monitoring individual charges at each of the plurality of touch sensitive locations in the display with a corresponding measurement circuit;
  one or more instructions for identifying a change in one or more of the monitored individual charges to identify the location of the touch on the touch sensitive display;
  one or more instructions for identifying a distortion in one or more of the sub-threshold in response to a touch proximate to one or more touch-sensitive locations;
  one or more instructions for receiving a plurality of signals to a change in the individual charges for each of the touch-sensitive locations affected by the touch and determining a location of the touch by identifying one or more touch-sensitive locations having a highest degree of change in charge; or
  one or more instructions for delivering sub-threshold signals to the display at the plurality of touch-sensitive locations.

| 622 A computer-readable medium | 624 A recordable medium | 626 A communications medium |

FIG. 6A

TOUCH-SENSITIVE DISPLAY DEVICE AND METHOD

BACKGROUND

Touch screens are widely used for inputting data in a variety of electronic devices including hand-held devices such as mobile phones and cameras. In prior art touch screen applications, a touch screen sensor panel is disposed over or under a display, but the display does not play a role in determining the location of a touch. Rather, by touching the touch screen, a change is sensed in the touch screen panel, and a touch screen controller couples the sensor to a driver and/or computer processing unit ("CPU") and translates information from the touch sensor into data usable by the driver/CPU.

BRIEF DESCRIPTION OF THE FIGURES

The foregoing and other features of the present disclosure will become more fully apparent from the following description and appended claims, taken in conjunction with the accompanying drawings. Understanding that these drawings depict only several examples in accordance with the disclosure and are, therefore, not to be considered limiting of its scope, the disclosure will be described with additional specificity and detail through use of the accompanying drawings, in which:

FIG. 6A is a diagram of a computer program product that may be implemented in a computing device for sending and/or determining the location of a touch on a touch-sensitive display, in accordance with certain examples of the present disclosure.

DETAILED DESCRIPTION

Figure 1:
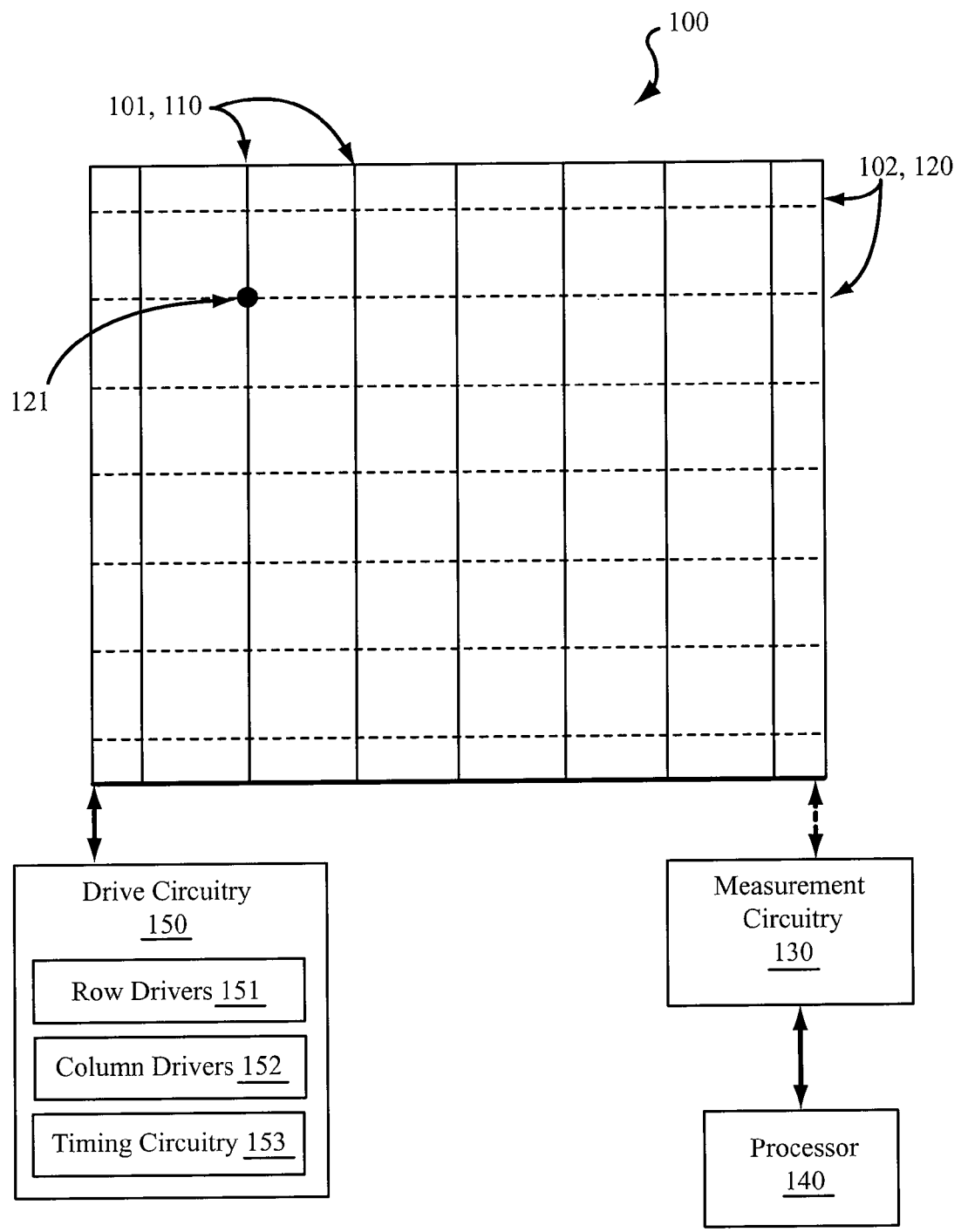
FIG. 1 depicts an OLED touch-sensitive display device according to certain examples of the present disclosure.

In the following detailed description, reference is made to the accompanying drawings, which form a part hereof. In the drawings, similar symbols typically identify similar components, unless context dictates otherwise. The illustrative examples described in the detailed description, drawings, and claims are not meant to be limiting. Other examples may be utilized, and other changes may be made, without departing from the spirit or scope of the subject matter presented herein. It will be readily understood that the aspects of the present disclosure, as generally described herein, and illustrated in the Figures, may be arranged, substituted, combined, separated, and designed in a wide variety of different configurations, all of which are explicitly contemplated herein.

This disclosure is drawn, inter alia, to methods, apparatus, computer programs and systems related to accurately identifying the location of a touch on a display by providing a shared circuit that integrates display and measurement circuitry.

According to certain implementations, a touch-sensitive LED display includes shared sensing and display circuitry in which touch sensor circuitry is electrically coupled to display circuitry driving a LED display. In this implementation, a single LED display panel may serve as both a display (e.g., computer monitor display, mobile device display) and as a touch screen. By combining display and touch-sensitive circuitry, calibration requirements between touch screens and displays are eliminated. That is, in previous touch screen applications, the underlying or overlying display is physically decoupled from the touch screen and may drift from the touch screen, or vice versa. Thus, periodic calibration by a user is required. In addition, the manufacturing processes for touch-sensitive displays are simplified compared to touch screen and display processes because less steps are involved. For example, manufacturing of previous touch screen and display devices involves precise alignment of touch screen panels and display panels to ensure the placement of a touch will correspond to the desired location on the display. In addition, the touch-sensitive display is constructed of shared circuitry and thus includes less manufacturing steps than the manufacturing steps involved in producing touch screen circuitry and display circuitry. Accordingly, in examples disclosed herein, the display is touch-sensitive, thus removing the complexity of calibration and intricate manufacturing steps involved in applications in which touch screens are physically decoupled from displays.

According to certain implementations, the shared sensing and display circuitry is operable when one or more portions of the LED display are not visibly illuminated. For example, when the portion of the display is not active or not visibly illuminated, a sub-threshold signal (e.g., a sub-threshold alternating current sinusoidal, square, and/or triangular wave, which is lower than the display on-voltage threshold/illumination threshold) having a low voltage, such as 0.5 volts, is introduced to the shared circuitry. A touch to the touch-sensitive display may cause the sub-threshold signal to change, and the measurement circuitry associated with each of the shared circuits affected by the touch may sense a change in the sub-threshold signal. The location of the touch may be identified by comparing data associated with the sensed change for each of the circuits affected by the touch.

In a further implementation, by introducing a sub-threshold signal to the device, the shared circuitry is provided with a signal reference point, and a signal distortion (e.g., a sine wave distortion, a change in capacitance or drop in voltage) may be detected by measurement components from the shared circuitry when the touch-sensitive LED display is touched. For example, a degree or magnitude of signal distortion from the reference point is sensed by the measurement circuitry for each shared circuit affected by the touch. In another example, the sub-threshold signal reference point is a reference capacitance, and a touch causes the capacitance to drain from the circuit. According to certain implementations, this degree of change in each circuit is related to the force or displacement on the touch-sensitive display resulting from the finger touch. The harder the display is touched, the higher the degree of distortion in the sub-threshold signal (e.g., the capacitance field and/or electrical current is changed to a higher degree).

The shared circuits described above may provide a processor with data associated with the change in the shared circuit, the degree or magnitude of sine wave distortion sensed by the shared circuit, or the change in capacitance sensed by the circuit. The processor may use the data from the shared circuit to determine the circuit(s) experiencing the highest degree of change, and may identify one or more areas of the touch-sensitive LED display as the location(s) of the touch (e.g., the central force points or the focal points of the touch).

Certain possible examples are described below with reference to the figures. Components not essential to the implementations are omitted for the sake of clarity. While certain examples are described below in relation to dual-purpose organic LED (OLED) devices serving as an OLED touch screen and as an OLED display, implementations may be applicable to a variety of LED display types including, but not limited to: chip-based (inorganic) LED displays, including surface mount device (SMD) LED displays, which may be integrated with a variety of types of touch sensor circuitry.

FIG. 1 depicts an OLED touch-sensitive display device 100 according to certain examples of the present disclosure. The device 100 of FIG. 1 serves as both an OLED touch screen and an OLED display, and includes: a first OLED touch-sensitive display layer 101, a second OLED touch-sensitive display layer 102, first layer columns 110, second layer rows 120, nodes 121, measurement circuitry 130, a processor 140 and drive circuitry 150 with row drivers 151, column drivers 152 and timing circuitry 153.

In FIG. 1, the first OLED touch-sensitive display layer 101 may include a series of columns 110 disposed over the second OLED touch-sensitive layer having a series of rows 120. Columns 110 and rows 120 may be formed of one or more conductive layers separated by a series of organic layers (not shown), such as two or more layers of organic molecules or polymers having OLED conductive and/or emissive properties. When a voltage is applied to OLED touch-sensitive display device 100, columns 110 and rows 120 are oppositely charged, and each column 110/ row 120 intersection point corresponds to a node 121 of the touch-sensitive display device 100 that may carry a reference signal (e.g., a sine wave reference point) or that may be illuminated. A node 121 may be considered a type or part of a transistor and/or may be considered an OLED pixel. When drive circuitry 150 supplies a low voltage, a sub-threshold signal is provided to the conductive layers, and a reference capacitance field is formed therebetween. In this state, the node 121 may provide signals to the measurement circuitry 130. When the drive circuitry 150 supplies a voltage that is greater than the illumination threshold value (e.g., at least 1 volt), electrical current flows from the negatively charged touch-sensitive display layer to the positively charged touch-sensitive display layer, the current passes through the series of organic layers, and causes electrons in the organic layer to give up energy in the form of a photon of light or in the form of heat. In this state, the nodes 121 provide visible light and a user may view objects provided on the illuminated display.

According to certain examples, a sub-threshold signal may be introduced to the device 100 at node 121 (e.g., at a pixel) at times when the node 121 is not being driven (e.g., when the device at node 121 is between frames or between scans), and a capacitance is generated. The initial sub-threshold voltage may be used as a reference point, and the capacitance field generated in the display, when free of touching, may be known. At node(s) 121 where the display is touched, the corresponding shared measurement and display circuitry may experience a change as a result of the touch, such as a change in voltage due to a capacitance change in the display. This is because when a finger touches the screen, the finger (i.e., the living body) has stored electrons and exhibits a capacitance. The touch draws a certain amount of the current to the point of contact, which may create a change in voltage, e.g., a voltage drop or increase in capacitance, or distorts the sub-threshold signal. For example, a finger touch on the display may cause the effective resistance to ground to decrease, which causes the sub-threshold signal to decrease. Thus, touching the display may change the normal, reference capacitance between the first and second layers 201, 202. For each of the nodes 121 and associated measurement circuitry 130 affected by the touch, a processor 140 may receive and compare the differences between the circuitry signals to determine the location of the touch on the display.

Figure 2:
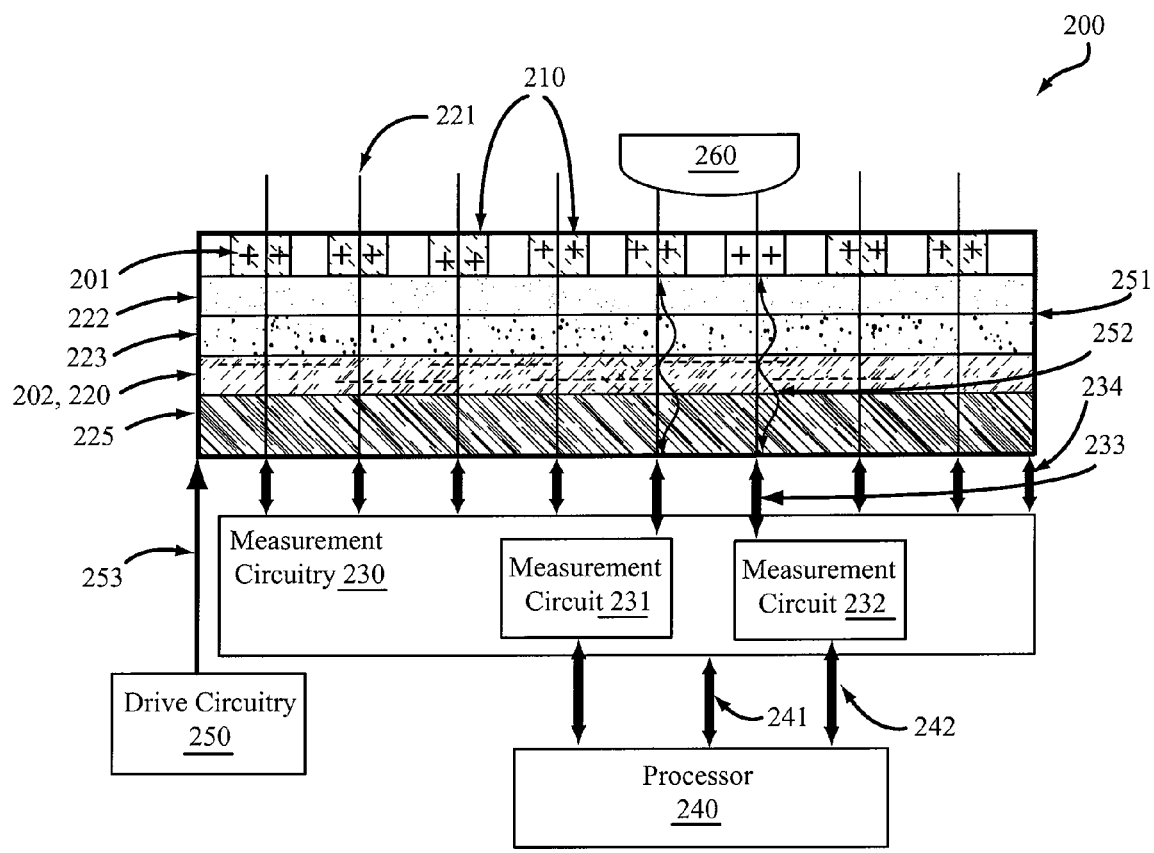
FIG. 2 depicts a cross-sectional view across a row of an OLED touch-sensitive display device that may carry out methods for sensing a touch according to certain examples of the present disclosure.

FIG. 2 depicts a cross-sectional view across a row of an OLED touch-sensitive display device 200 that may carry out methods for sensing a touch according to certain examples of the present disclosure. The device 200 of FIG. 2 includes a first OLED touch-sensitive display layer 201, a second OLED touch-sensitive display layer 202, first layer columns 210, second layer row 220, nodes 221, intermediate emissive and/or conductive organic polymer layers 222, 223, substrate 225, measurement circuitry 230 with measurement circuits 231 and 232, connections 233 and 234, processor 240, drive circuitry 250, connection 253, and touch 260. Nodes 221 may correspond to column/row intersection points, and each node may form a display circuit which is coupled to a measurement circuit 230 to provide a shared display and measurement circuit. In certain implementations, the measurement circuitry may be arranged behind the display circuitry such that the display is visible to a user and the measurement circuitry is hidden behind the display.

According to certain implementations, the various layers, nodes and circuits associated with display of display device 200 may be responsible for providing a plurality of touch-sensitive locations and measurement circuitry electrically coupled to the display and to each of the plurality of touch-sensitive locations. In some examples, the display provided may be an OLED display. Accordingly, device 200 may be at least partially constructed of a series of layers deposited on substrate 225. For example, the second OLED touch-sensitive display layer 202 may be deposited on substrate 225 via printing and/or vacuum deposition. The second OLED touch-sensitive display layer 202 may be a transparent conductive coating such as indium tin oxide in rows 220. Subsequent intermediate organic layers 222, 223 may be deposited on second OLED touch-sensitive display layer 202 via printing, vacuum deposition, and/or organic vapor phase deposition. The first OLED touch-sensitive display layer 201 may be a transparent conductive coating, such as a transparent metallic coating, an may also be deposited on the intermediate layers 222, 223 using processes similar to those used in depositing the second OLED touch-sensitive display layer 202.

According to some examples, drive circuity 250 coupled to display via connection 253 may be responsible for generating a charge in the display and measurement circuitry at a location associated with at least one of the touch-sensitive locations to generate a change in its respective associated measurement circuitry indicative of the location of the touch. For example, measurement circuitry 230 may be electrically coupled at each node 221 via connection 233 and to the OLED touch-sensitive display 200 generally via connection 234.

In further examples, drive circuitry 250 may be responsible for delivering a sub-threshold signal to the display at the plurality of touch-sensitive locations, and for allowing the distortion of the sub-threshold signal in response to a touch proximate to one or more touch-sensitive locations.

In addition, processor 240 may be communicatively coupled to measurement circuitry 230 generally via connection 241 and to measurement circuits, e.g., measurement circuit 231 may be coupled to processor 240 via connection 242. When a node 221 is touched 260 at first OLED touch-sensitive display layer 201, a change in the display circuit 252 corresponding to each node touched may be detected by its respective measurement circuit. For example, in FIG. 2, measurement circuit 231 senses a change 252 in its corresponding display circuit affected by touch 260 and measurement circuit 232 may sense a change 252 in its corresponding display circuit affected by touch 260. Each measurement circuit 231, 232 affected by the touch 260 may provide signals to processor 240, which may analyze the signals and determine the location of the touch.

In some examples, a processor 240 coupled to the measurement circuitry 230 may be responsible for receiving a plurality of signals from the measurement circuitry corresponding to the change in measurement circuitry for each of the touch-sensitive locations affected by the touch; and determining a location of the touch by identifying one or more touch-sensitive locations having a highest degree of change.

OLED devices may be useful in combined touch screen and a display applications, such as OLED touch-sensitive display device 200, because, in order for the display and the touch screen functions of the OLED touch-sensitive display device 200 to operate, both require drive circuitry 250 to apply a voltage to the oppositely charged conductive layers 201, 202 (e.g., layer 201 is positively charged and layer 202 is negatively charged). When the voltage applied is below the display activation threshold, the shared circuits exhibit a capacitance (e.g., capacitance field 251 between the positively charged and negatively charged OLED layers), and photons of light are not given off by the intermediate emissive layer 222 and/or 223. As a result, by introducing a sub-threshold signal to the device 200, the display function of the OLED touch-sensitive display device 200 may not be operational, but the sensing function of the OLED touch-sensitive display device 200 may be operational because associated measurement circuitry, described further below, may sense a small sine wave distortion or change in capacitance in the OLED device. In instances where the voltage applied meets or exceeds the activation threshold, the display function of the OLED touch-sensitive display device 200 may be operational. Thus, when a relatively low amount of energy is supplied to the device, the touch screen function may be operational, and when a relatively higher amount of energy is supplied, the display function may be operational. Because the voltage applied to the shared circuits may change rapidly, the display and sensing functions of the OLED touch-sensitive display may appear to happen near simultaneously.

Figure 3:
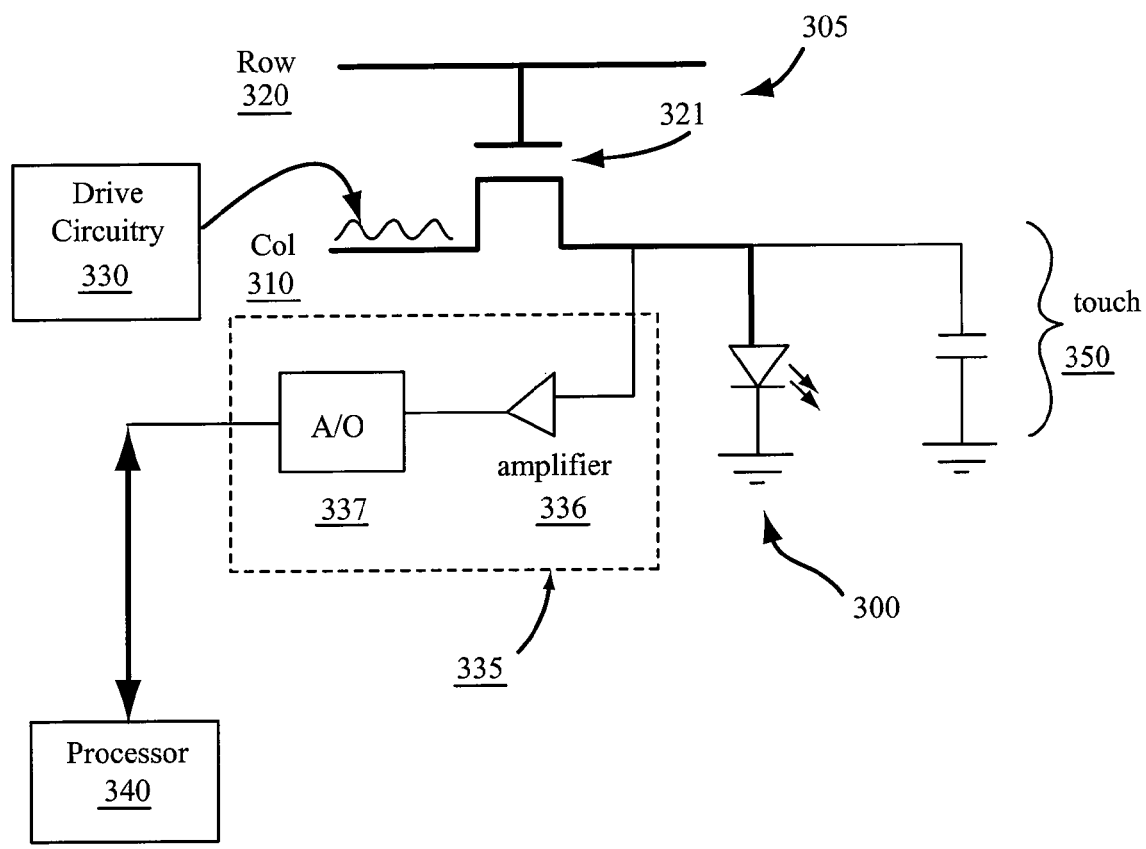
FIG. 3 depicts a schematic of an OLED shared display and measurement circuit according to certain examples of the present disclosure.

According to certain implementations, the OLED display nodes are associated with a number of electrical components, which together form a shared display and measurement circuit. FIG. 3 depicts a schematic of an OLED shared display and measurement circuit 300 according to certain examples of the present disclosure. In FIG. 3, OLED shared display and measurement circuit 300 includes a touch-sensitive display pixel 305 having first layer column 310, second layer row 320, node 321 (i.e., drive transistor), drive circuitry 330 configured to at least deliver a sub-threshold sinusoidal wave to the OLED touch sensor circuit 300, measurement circuitry 335 with amplifier 336 and analog-to-digital converter 337, and a connection to or a communicative coupling with a processor 340. A capacitance 350 associated with a screen touch may also form a part of the LED circuit 300, when present.

For OLED shared display and measurement circuit 300, a known voltage may be applied via the drive circuitry 330 across the touch-sensitive display pixel 305 at a sub-threshold level so that the device is not active/visibly illuminated but exhibits a reference capacitance field. A capacitance 350 is applied to the touch-sensitive display at pixel 305 via a touch, and results in a current flow, e.g., from the capacitance between the touch-sensitive display pixel 305 and a finger, and subsequently via the body of the user touching the ground. The current flow resulting from the touch may be transmitted to the measurement circuitry 335, which measures the change in current for OLED shared display and measurement circuit 300. In the measurement circuitry 335, amplifier 336 amplifies measurement signals, analog-to-digital converter 337 converts the signal to a digital signal, and the amplified digital signal may be sent to processor 340 for determining the location of the touch.

An OLED touch-sensitive display device includes a number of shared display and measurement circuits 300, and the sensor circuits are affected to varying degrees depending on the strength of the touch in the area of node 321 associated with the circuit. Accordingly, the processor 340 may receive signals of varying magnitudes from a number of nodes 321, e.g., 2, 4, 6, 8, 10, 20, 30, 100, 200, 300, 500 or more nodes 321, which may be affected by one or more touches. The signals corresponding to the force or displacement of the display at the various nodes 321 may be processed, and the node(s) 321 having the highest magnitude of change may be identified as the location of the touch. Although OLED touch-sensitive display devices may include an OLED touch sensor circuit 300 corresponding to each node 321, in alternative examples, the OLED touch-sensitive display devices may include OLED shared display and measurement circuits 300 for 99 to 100 percent, 95 to 100 percent, 80 to 95 percent 50 to 100 percent, 50 to 75 percent, or 10 to 50 percent of the nodes 321, with the remainder percent being non-sensing OLED circuits (e.g., OLED circuits that do not include measurement circuitry 335 coupled to a processor 340 for sensing a capacitance 350).

Figure 4A:
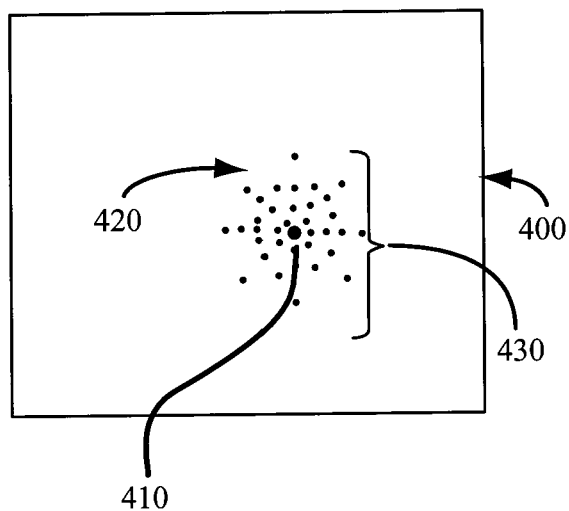
FIGS. 4A-B depict a touch on a tactile or touch-sensitive display according to certain examples of the present disclosure.
Figure 4B:
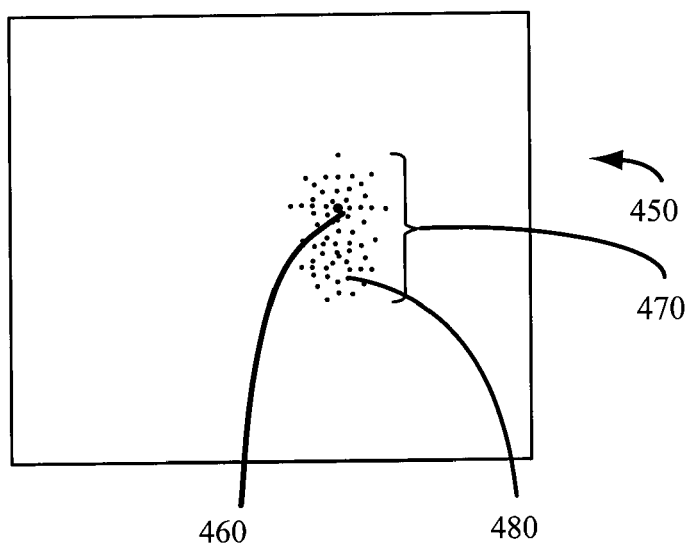

FIGS. 4A-B depict a touch on a tactile or touch-sensitive display according to certain examples of the present disclosure. FIG. 4A depicts a touch on a tactile or touch-sensitive display 400 including a central force point of the touch 410 according to certain examples of the present disclosure. In FIG. 4A, each point 420 shown on the tactile screen is associated with a different node affected by the touch. The grouping of points 430 affected by the touch radiate from the central force point 410. Although one touch is depicted on touch-sensitive display 400, it will be understood that touch-sensitive displays provided according to certain examples may be configured to sense multiple simultaneous or near simultaneous touches. This is because the measurement circuitry in the shared display and measurement circuits detects a change in the circuitry on a per node or per pixel basis. Thus, for example, a textured or patterned object with multiple contacts may be used to touch the display at multiple contact points simultaneously, and the device may determine the locations of each of the contact points. In another implementation, a textured or shaped object having contacts separated by recesses or gaps may be used to contact the screen and the device may identify the location(s) of the gap between the portions of the display contacted.

FIG. 4B depicts another touch on a touch-sensitive display 450 including a maximum force point 460 of the touch (e.g., the location of the display touched the hardest), according to certain examples of the present disclosure. It may be appreciated from FIG. 4B that while the maximum force point 460 of a touch may be determined, determining a general area of the screen affected by the touch, shown as a grouping of points 470 radiating downward and outward from the maximum force point 460, may be useful for certain processing functions. For example, where a substantial portion of the touch-sensitive display 450 affected by the touch is below the maximum force point 460, the intended positioning of the touch may be in the area corresponding to a central portion 480 on the screen affected by the touch and not the maximum force point 460. Accordingly, in certain examples, a processor may receive signal data corresponding to the degree of change in each LED touch sensor circuit affected by the touch, and may determine a maximum force point 460 of the touch, and if present, a central point 480 of an area of the touch-sensitive display substantially affected by the touch. If the overall area of the touch-sensitive display affected by the touch corresponds to multiple functions or commands, the processor may compare the relative strengths of the maximum force point and central point and may execute the function or command corresponding to the area of the screen receiving the portion of the touch having the higher relative strength.

Figure 5A:
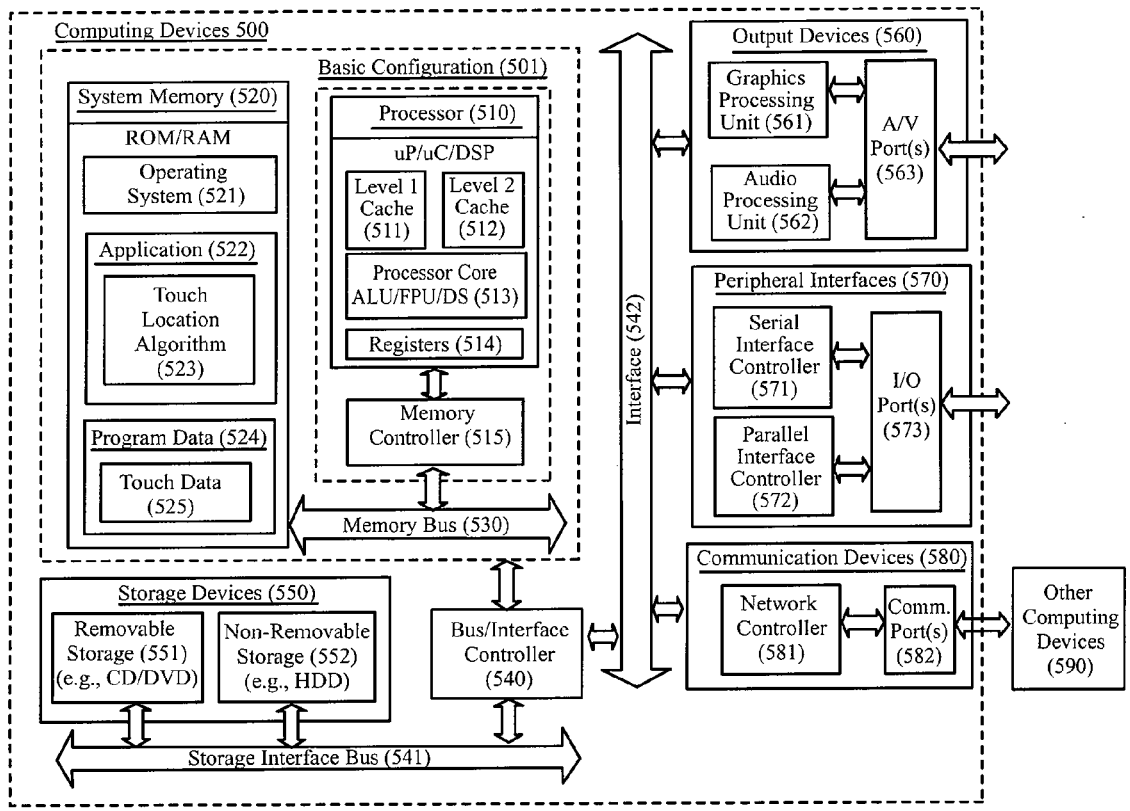
FIG. 5A is a block diagram of a suitable computing device in which shared display and measurement circuitry may be integrated in order to execute methods for identifying the location of a touch in accordance with the present disclosure.

The OLED touch sensor circuitry 300 described in relation to FIG. 3 may be integrated within a computing environment in order to identify the location of a touch. FIG. 5A is a block diagram of a suitable computing device 500 in which shared display and measurement circuitry may be integrated in order to execute methods for identifying the location of a touch in accordance with the present disclosure. In a very basic configuration 501, computing device 500 typically includes one or more processors 510 and system memory 520. A memory bus 530 may be used for communicating between the processor 510 and the system memory 520.

Depending on the desired configuration, processor 510 may be of any type including but not limited to a microprocessor (µP), a microcontroller (µC), a digital signal processor (DSP), or any combination thereof. Processor 510 may include one or more levels of caching, such as a level one cache 511 and a level two cache 512, a processor core 513, and registers 514. The processor core 513 may include an arithmetic logic unit (ALU), a floating point unit (FPU), a digital signal processing core (DSP Core), or any combination thereof. A memory controller 515 may also be used with the processor 510, or in some implementations the memory controller 515 may be an internal part of the processor 510.

Depending on the desired configuration, the system memory 520 may be of any type including but not limited to volatile memory (such as RAM), non-volatile memory (such as ROM, flash memory, etc.) or any combination thereof. System memory 520 typically includes an operating system 521, one or more applications 522, and program data 524. Application 522 includes an algorithm 523 that is arranged to determine the location of a touch on a touch-sensitive display. Program Data 524 includes touch data 525 that is useful for accurately identifying the location of a touch. In some examples, application 522 may be arranged to operate with program data 524 on an operating system 521 such that the location of a touch on a touch-sensitive display may be identified. This described basic configuration is illustrated in FIG. 5A by those components within dashed line 501.

Computing device 500 may have additional features or functionality, and additional interfaces to facilitate communications between the basic configuration 501 and any required devices and interfaces. For example, a bus/interface controller 540 may be used to facilitate communications between the basic configuration 501 and one or more data storage devices 550 via a storage interface bus 541. The data storage devices 550 may be removable storage devices 551, non-removable storage devices 552, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 520, removable storage 551 and non-removable storage 552 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 500. Any such computer storage media may be part of device 500.

Computing device 500 may also include an interface bus 542 for facilitating communication from various interface devices (e.g., output interfaces, peripheral interfaces, and communication interfaces) to the basic configuration 501 via the bus/interface controller 540. Example output devices 560 include a graphics processing unit 561 and an audio processing unit 562, which may be configured to communicate to various external devices such as a display or speakers via one or more A/V ports 563. Example peripheral interfaces 570 include a serial interface controller 571 or a parallel interface controller 572, which may be configured to communicate with external devices such as input devices (e.g., keyboard, mouse, pen, voice input device, touch input device, etc.) or other peripheral devices (e.g., printer, scanner, etc.) via one or more I/O ports 573. An example communication device 580 includes a network controller 581, which may be arranged to facilitate communications with one or more other computing devices 590 over a network communication via one or more communication ports 582. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR) and other wireless media. The term computer readable media as used herein may include both storage media and communication media.

Computing device 500 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 500 can also be implemented as a personal computer including both laptop computer and non-laptop computer configurations. Computing device 500 can also be implemented as an interactive system such as an information kiosk, television, or a gaming device.

Figure 5B:
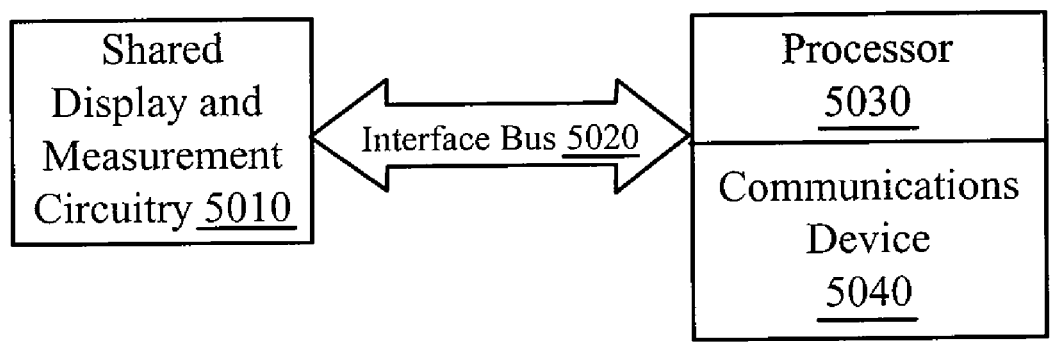
FIG. 5B is a block diagram of shared display and measurement circuitry communicatively coupled to a processor in a computing device in accordance with the present disclosure.

FIG. 5B is a block diagram of shared display and measurement circuitry 5010 communicatively coupled to a processor 5030 in a computing device in accordance with the present disclosure. According to FIG. 5B, the shared display and measurement circuitry 5010 is communicatively coupled, via interface bus 5020, to a processor 5030 and/or a communications device 5040 in a computing device, in accordance with the present disclosure.

The present disclosure is applicable to a variety of touch screen/LED display applications, including touch screen displays for mobile phones, personal computers, PDAs, public access terminals, gaming machines, point of sale terminals, kiosks, ATMs, industrial terminals, and LED screens for televisions, motor vehicles, outdoor applications, and indoor applications. Touch screen LED displays may be small, e.g., 1 cm.×1 cm., 1"×1", 2"×3", 4"×3", 9"×11" or large, e.g., 2'×2', 8'×6', 10'×12', depending on the type of application.

The foregoing describes various examples of OLED touch-sensitive displays. Following are specific examples of methods and systems of OLED touch-sensitive displays. These are for illustration only and are not intended to be limiting.

A device, according to one implementation, includes: a display including a plurality of touch-sensitive locations; and measurement circuitry electrically coupled to the display and electrically coupled to each of the plurality of touch-sensitive locations, where each of the touch-sensitive locations affected by a touch generates a change in its respective associated measurement circuitry.

In variations of the above implementation, the display is an organic LED (OLED) display, and in addition, the plurality of touch-sensitive locations may comprise OLED pixels. In addition or alternatively, the display may be a capacitive touch-sensitive display.

In another variation, the device may further include drive circuitry configured to provide at least a sub-threshold signal to the display, and when the sub-threshold signal is introduced to the display, a sub-threshold signal reference point is provided at the plurality of touch-sensitive locations, and the sub-threshold signal is distorted in response to a touch proximate to one or more touch-sensitive locations. In addition, the measurement circuitry may be configured to sense the change in the measurement circuitry as a signal distortion for each of the one or more touch-sensitive locations affected by the touch.

In addition or alternatively, the device may include a processor coupled to the measurement circuitry, and the processor may be configured to: receive a plurality of signals from the measurement circuitry corresponding to the change in measurement circuitry for each of the touch-sensitive locations affected by the touch; and determine a location of the touch by identifying one or more touch-sensitive locations having a highest degree of change. The processor may be further configured to: determine a central portion of the touch by identifying an area of the display substantially affected by the touch; and compare the relative strengths of the location of the touch and the central point of the touch to identify an intended position of the touch.

In some variations, each of the plurality of touch-sensitive locations may be a node, and the node may be an intersection of a row and a column of the touch-sensitive display. In addition, the touch-sensitive display row may include a first layer and the touch-sensitive display column includes a second layer, and the first and second layers are conductive and have an opposite charge when device is provided with a sub-threshold signal.

In yet another variation, the device may further include display circuitry, where the display circuitry is electrically coupled to the measurement circuitry and the electrically coupled display and measurement circuitry form a shared circuit. In addition, each of the plurality of touch-sensitive locations may be associated with one shared circuit. In addition or alternatively, the display may be an organic LED (OLED) display, and the display circuitry in the plurality of shared circuits may include: a first OLED display layer comprising a plurality of columns; a second OLED display layer comprising a plurality of rows; and a plurality of display nodes corresponding a plurality of intersecting areas of the plurality of columns and rows, where the display nodes form the plurality of touch-sensitive locations, and where measurement circuitry is electrically coupled to the display node for each of the shared circuits.

Another implementation provides a device that includes measurement circuitry and an OLED pixel electrically coupled to the measurement circuitry, where the OLED pixel emits light when the drive circuitry provides a voltage to at least the pixel above an illumination threshold, and where the OLED pixel provides signals to the measurement circuitry in response to a touch when the drive circuitry provides a voltage to the pixel below the illumination threshold.

In a variation of the above implementation, the voltage provided to the pixel that is below the illumination threshold generates a capacitance field at the pixel. In addition, the capacitance field at the pixel may be distorted in response the touch, and the measurement circuitry may sense the distortion in the capacitance field.

FIG. 6A is a diagram of a computer program product 600 that may be implemented in a computing device 500 for sending and/or determining the location of a touch on a touch-sensitive display, in accordance with certain examples of the present disclosure. The computer program product 600 includes a signal bearing medium 610 configured to execute one or more instructions 620. The signal bearing medium 610 may be configured as a computer-readable medium 622, a recordable medium 624 and/or a communications medium 626.

Figure 6B:
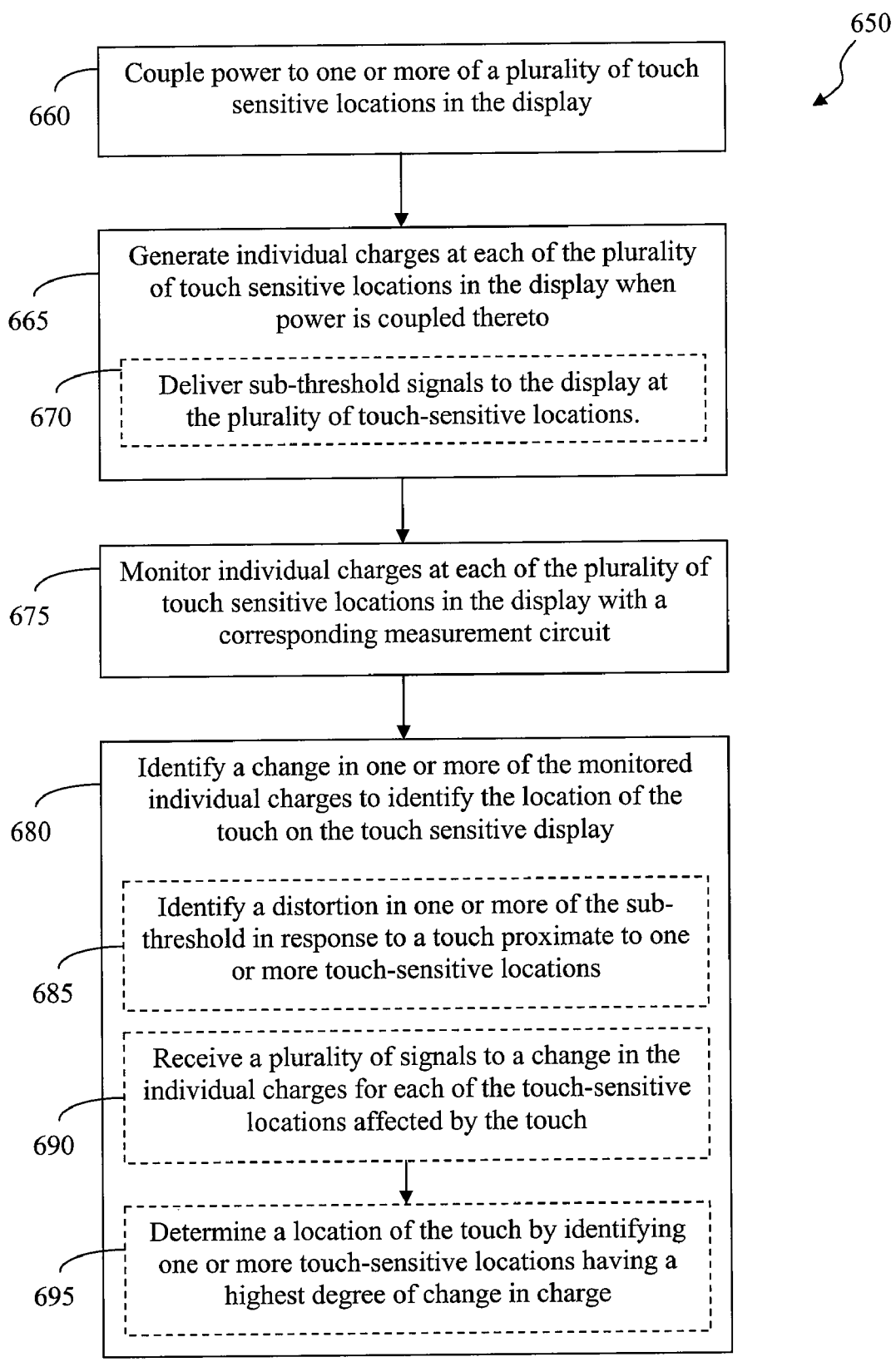
FIG. 6B is a flowchart of a computer-implemented method for sensing a touch on a touch-sensitive display device according to certain examples of the present disclosure.

FIG. 6B is a flowchart of a computer-implemented method 650 for sensing a touch on a touch-sensitive display device according to certain examples of the present disclosure. Method 650 may be implemented in computer program product 600 and/or in computing device 500 in accordance with the present disclosure. According to FIG. 6B, method 650 may include, coupling power to one or more of a plurality of touch-sensitive locations in the display (operation 660). Individual charges are generated at each of the plurality of touch-sensitive locations in the display when power is coupled thereto (operation 665). In certain implementations, sub-threshold signals are delivered to the display at the plurality of the touch-sensitive locations (operations 670). Monitoring of individual charges at each of the plurality of touch-sensitive locations in the display with a corresponding measurement circuit may be provided (operation 675). In response, the method may involve identification of a change in one or more of the monitored individual charges to identify the location of the touch on the touch-sensitive display (operation 680). In certain implementations, the identification may involve identifying a distortion in one or more of the sub-threshold in response to a touch proximate to one or more touch-sensitive locations (operation 685). In addition or alternatively, implementations may include identifying the change by receiving a plurality of signals to a change in the individual charges for each of the touch-sensitive locations affected by the touch (operation 690) and determining a location of the touch by identifying one or more touch-sensitive locations having a highest degree of change in charge (operation 695).

Figure 7:
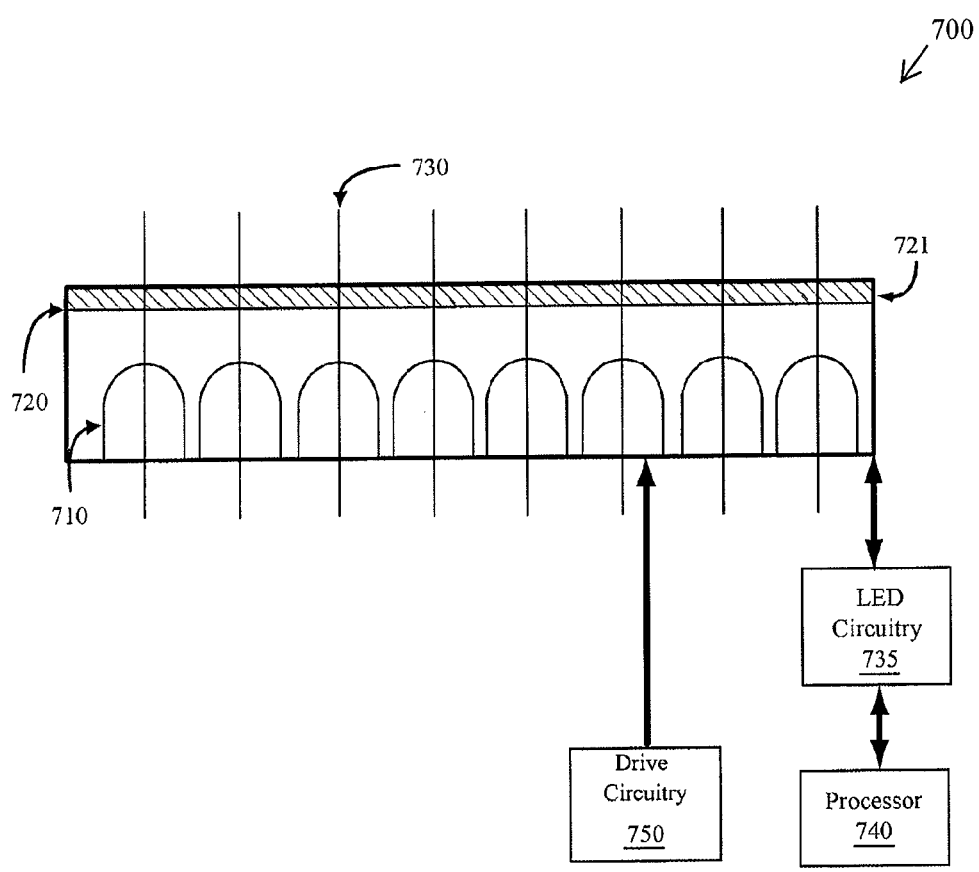
FIG. 7 depicts a cross-sectional view of a touch screen and LED display device arranged according to examples of the present disclosure.

The OLED touch-sensitive display devices disclosed herein may be implemented in passive-matrix, active-matrix, transparent, top-emitting, foldable and/or white OLED devices. Furthermore, a variety of implementations are contemplated in addition to those described above. For example, other LED types may be implemented in a touch screen LED display device. A device may include a chip-based LED display circuit integrated with capacitive touch screen circuitry. FIG. 7 depicts a cross-sectional view of a touch screen and LED display device 700 arranged according to examples of the present disclosure. Device 700 in FIG. 7 includes a row of LEDs 710, a touch screen 720 having a first conductive layer 721, LED/touch screen correspondence areas centered around lines 730, LED circuitry 735, a processor 740 and drive circuitry 750.

In the example of FIG. 7, touch screen 720 is a capacitive touch screen because it employs at least a first conductive layer 721. According to certain implementations, one or more conductive layers may be a coating of, or be coated with, a transparent metallic conductive coating such as indium tin oxide. When the drive circuitry 750 introduces a sub-threshold sinusoidal wave across touch screen 720 configured as a capacitive touch screen, a low voltage field is distributed across at least conductive layer 721, which may be used as a reference point. A finger touch to the screen draws a certain amount of the current to the point of contact, which may cause a sine wave distortion. The sine wave distortion in the area of the touch screen affected by the touch is transferred to one or more LEDs 710 electrically coupled to proximate portion(s) of the touch screen 720 affected by the touch, which may be one or more areas corresponding with lines 730. Circuitry 735, which may be similar to touch sensor circuitry 300, may be associated with each of the LEDs 710 and may sense the electrical change, and a processor 740 may determine a focal point of the touch.

Other implementations may provide touch-sensitive displays or touch screens with measurement circuits that employ resistive technology, surface acoustic wave/ultrasonic wave technology, acoustic pulse recognition technology, dispersive signal technology, frustrated total internal reflection technology, infrared technology, and/or strain gauge technology. For example, electric signals associated with sensing a touch on a display employing one or more of the aforementioned technologies may cause electrically coupled LED display and measurement circuit(s) to experience a change, and a processor in association with measurement circuits coupled to each of the LEDs affected may determine the location of the touch.

The present disclosure is not to be limited in terms of the particular examples described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular examples only, and is not intended to be limiting.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various examples of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. In one example, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the examples disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative example of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or coupled with, different other components. It is to be understood that such depicted architectures are merely examples, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and examples have been disclosed herein, other aspects and examples will be apparent to those skilled in the art. The various aspects and examples disclosed herein are for purposes of illustration and are not intended to be limiting, with the true scope and spirit being indicated by the following claims.

What is claimed is:

1. A device that is responsive to a touch from a user, the device comprising:
   a display comprising a plurality of touch-sensitive locations;
   measurement circuitry electrically coupled to both the display and to each of the plurality of touch-sensitive locations, wherein each of the touch-sensitive locations affected by the touch generates a respective signal change having a magnitude corresponding to a strength of the touch in its respective associated measurement circuitry; and a processor coupled to the measurement circuitry, wherein the processor is configured to receive a plurality of respective signal changes from the measurement circuitry corresponding to a plurality of the touch-sensitive locations affected by the touch, and wherein the processor is further configured to determine a location of the touch by identifying one or more touch-sensitive locations of the plurality of the touch-sensitive locations affected by the touch where the respective signal change has a highest magnitude.

2. The device of claim 1, wherein the display comprises an organic LED (OLED) display.

3. The device of claim 2, wherein the plurality of touch-sensitive locations comprise OLED pixels.

4. The device of claim 1, wherein the display comprises a capacitive touch-sensitive display.

5. The device of claim 1, further comprising drive circuitry configured to provide a plurality of sub-threshold signals to the display, wherein when the plurality of sub-threshold signals are provided to the display, a sub-threshold signal reference point is provided at each of the plurality of touch-sensitive locations, wherein the sub-threshold signals associated with each of the touch-sensitive locations affected by the touch are distorted in response to the touch proximate to the corresponding touch-sensitive locations.

6. The device of claim 5, wherein the measurement circuitry is configured to sense distortion in sub-threshold signals for each of the touch-sensitive locations affected by the touch.

7. The device of claim 1, wherein the processor is further configured to:
determine a central portion of the touch by identifying an area of the display substantially affected by the touch; and
compare the relative strengths of the signal changes at the location of the touch and the central point of the touch to identify an intended position of the touch.

8. The device of claim 1, wherein each of the plurality of touch-sensitive locations comprise a node, the node comprising an intersection of a row and a column of the touch-sensitive display.

9. The device of claim 8, wherein the touch-sensitive display row comprises a first layer and the touch-sensitive display column comprises a second layer, and the first and second layers are conductive and have an opposite charge when provided with a sub-threshold signal.

10. The device of claim 1, further comprising display circuitry, wherein the display circuitry is electrically coupled to the measurement circuitry and the electrically coupled display and measurement circuitry comprises a shared circuit.

11. The device of claim 10, wherein each of the plurality of touch-sensitive locations is associated with one shared circuit.

12. The device of claim 10, wherein the display comprises an organic LED (OLED) display and the display circuitry in the plurality of shared circuits comprises:
a first OLED display layer comprising a plurality of columns;
a second OLED display layer comprising a plurality of rows; and
a plurality of display nodes corresponding to a plurality of intersecting areas of the plurality of columns and rows, the display nodes comprising the plurality of touch-sensitive locations; and
measurement circuitry electrically coupled to each of the plurality of display nodes for each of the plurality of shared circuits.

13. A device that is responsive to a touch from a user when powered by a voltage from a power supply, the device comprising:
an OLED pixel electrically coupled to a measurement circuitry, wherein the OLED pixel is configured to emit light responsive to a first voltage exceeding an illumination threshold for the OLED pixel, and wherein the OLED pixel is also configured to provide signals to the measurement circuitry in response to the touch responsive to a second voltage less than the illumination threshold, and wherein the measurement circuitry is configured, responsive to a touch of the OLED pixel, to provide a signal having a magnitude corresponding to a strength of the touch such that the signal has a first magnitude responsive to the touch having a first strength and a second magnitude responsive to the touch having a second strength different from the first strength.

14. The device of claim 13, wherein the OLED pixel is arranged to generate a capacitance field at the OLED pixel when the voltage from the power supply fails to exceed the illumination threshold.

15. The device of claim 14, wherein the capacitance field at the OLED pixel is distorted in response the touch, and wherein the measurement circuitry senses the distortion in the capacitance field.

16. A method for determining a location of a touch on a touch-sensitive display, wherein the display includes a plurality of touch-sensitive locations, the method comprising:
coupling power to one or more of the plurality of touch-sensitive locations in the display;
generating individual charges at each of the plurality of touch-sensitive locations in the display when power is coupled thereto, wherein generating individual charges comprises providing sub-threshold signals to the display at the plurality of touch-sensitive locations;
monitoring the individual charges at each of the plurality of touch-sensitive locations in the display with a corresponding measurement circuit, wherein the corresponding measurement circuit is configured to provide a signal having a magnitude corresponding to a strength of the touch; and
identifying a change, responsive to a touch, in a plurality of the monitored individual charges to identify the location of the touch on the touch-sensitive display by identifying a location associated with a highest magnitude change of the plurality of monitored individual charges.

17. The method claim 16, wherein identifying the change in one or more of the monitored individual charges comprises identifying a distortion in one or more of the sub-threshold signals in response to a touch proximate to the one or more touch-sensitive locations.

18. The method of claim 16, wherein identifying the change in one or more of the monitored individual charges comprises:
receiving a signal corresponding to a change in the monitored individual charges for each of the touch-sensitive locations affected by the touch; and
determining a location of the touch by identifying one or more touch-sensitive locations having a highest degree of change in the monitored individual charge.

19. The device of claim 13, further comprising drive circuitry configured to provide the second voltage and a reference signal to the OLED pixel.

* * * * *